United States Patent
Lin et al.

(10) Patent No.: US 10,866,666 B2
(45) Date of Patent: Dec. 15, 2020

(54) TOUCH DISPLAY PANEL, MANUFACTURING METHOD THEREOF AND TOUCH DISPLAY DEVICE

(71) Applicant: BOE TECHNOLOGY GROUP CO., LTD., Beijing (CN)

(72) Inventors: Chun I Lin, Beijing (CN); Ming Hsi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/304,828

(22) PCT Filed: Mar. 9, 2018

(86) PCT No.: PCT/CN2018/078614
§ 371 (c)(1),
(2) Date: Nov. 27, 2018

(87) PCT Pub. No.: WO2019/019655
PCT Pub. Date: Jan. 31, 2019

(65) Prior Publication Data
US 2019/0324582 A1 Oct. 24, 2019

(30) Foreign Application Priority Data

Jul. 27, 2017 (CN) .......................... 2017 1 0625163

(51) Int. Cl.
*G06F 3/041* (2006.01)
*G02F 1/1333* (2006.01)
(Continued)

(52) U.S. Cl.
CPC ........ *G06F 3/0412* (2013.01); *G02F 1/13338* (2013.01); *G02F 1/133512* (2013.01);
(Continued)

(58) Field of Classification Search
CPC ................. G06F 3/0412; G06F 3/0443; G06F 2203/04103; G02F 1/136209;
(Continued)

(56) References Cited

U.S. PATENT DOCUMENTS 9,786,721 B1  10/2017  Tang
2004/0080684 A1*  4/2004  Rho ..................... G02F 1/1362
                                                    349/106
(Continued)

FOREIGN PATENT DOCUMENTS

CN  101699332 A  4/2010
CN  103226423 A  7/2013
(Continued)

OTHER PUBLICATIONS

International Search Report and Written Opinion dated Jun. 7, 2018 from State Intellectual Property Office of the P.R. China.
First Chinese Office Action dated Feb. 27, 2019.

*Primary Examiner* — Brent D Castiaux
(74) *Attorney, Agent, or Firm* — Dilworth & Barrese, LLP.; Michael J. Musella, Esq.

(57) ABSTRACT

A touch display panel, a manufacturing method thereof and a touch display device are provided. The touch display panel includes: a black matrix; and a plurality of pixel units arranged in an array; the black matrix is a conductor, and includes a plurality of light-shielding conductive patterns which are insulated from each other.

19 Claims, 11 Drawing Sheets

(51) Int. Cl.
*G02F 1/1335* (2006.01)
*G02F 1/1362* (2006.01)
*H01L 27/32* (2006.01)

(52) U.S. Cl.
CPC .. *G02F 1/133514* (2013.01); *G02F 1/136209* (2013.01); *H01L 27/322* (2013.01); *H01L 27/323* (2013.01)

(58) Field of Classification Search
CPC ........... G02F 1/13338; G02F 1/133514; G02F 1/133512; H01L 27/322; H01L 27/323; H01L 51/5284; H01L 51/56
See application file for complete search history.

(56) References Cited

U.S. PATENT DOCUMENTS

| | | | |
|---|---|---|---|
| 2014/0071360 A1* | 3/2014 | Chang | G06F 3/0412 349/12 |
| 2014/0092326 A1 | 4/2014 | Zhou et al. | |
| 2014/0166998 A1* | 6/2014 | Lee | H01L 27/323 257/40 |
| 2014/0217431 A1* | 8/2014 | Aoyagi | H01L 51/5284 257/89 |
| 2015/0309631 A1* | 10/2015 | Wang | G06F 1/16 345/174 |
| 2016/0252994 A1* | 9/2016 | Yoo | G06F 3/044 345/174 |
| 2017/0205647 A1 | 7/2017 | Feng et al. | |
| 2017/0219897 A1 | 8/2017 | Jin | |

FOREIGN PATENT DOCUMENTS

| | | | |
|---|---|---|---|
| CN | 103294296 A | | 9/2013 |
| CN | 104570461 A | | 4/2015 |
| CN | 205900543 U | | 1/2017 |
| CN | 106371254 A | | 2/2017 |
| CN | 106526935 A | * | 3/2017 |
| CN | 106526935 A | | 3/2017 |
| CN | 107340928 A | | 7/2017 |
| KR | 1020150031829 A | | 3/2015 |

\* cited by examiner manufacturing a touch display panel including a plurality of pixel units arranged in an array and a BM, the BM being a conductor and being connected with a touch IC — 701

TOUCH DISPLAY PANEL, MANUFACTURING METHOD THEREOF AND TOUCH DISPLAY DEVICE

CROSS-REFERENCE TO RELATED APPLICATION

The present application claims priority to the Chinese patent application No. 201710625163.2, filed on Jul. 27, 2017, the entire disclosure of which is incorporated in its entirety herein by reference as a part of the present application.

TECHNICAL FIELD

Embodiments of the present disclosure relate to a touch display panel, a manufacturing method thereof and a touch display device.

BACKGROUND

Along with the development of display technology, organic light-emitting diode (OLED) display devices with touch function are widely applied. Illustratively, the OLED display device with touch function may include: an OLED display substrate, a cover plate and a touch panel which are stacked.

In related art, a touch panel includes a base substrate and touch electrodes which are disposed on the base substrate, and the touch electrodes are connected to a touch integrated circuit (IC). In the process of realizing the touch function of the OLED display panel, a display IC can apply an alternating current (AC) signal to the touch electrodes through a touch IC, acquire the capacitance of a capacitor formed by the touch electrodes and the ground, determine a touch position on the OLED display panel, and control the OLED display panel to display a corresponding image according to the touch position on the OLED display panel.

SUMMARY

At least one embodiment of the present disclosure relates to a touch display panel, a manufacturing method thereof and a touch display device, which can reduce the thickness of both the touch display panel and the touch display device.

At least one embodiment of the present disclosure provides a touch display panel, including: a black matrix (BM); and a plurality of pixel units arranged in an array; the BM includes a plurality of light-shielding conductive patterns which are insulated from each other.

According to the touch display panel provided by one or more embodiments of the present disclosure, the BM is connected with a touch integrated circuit (IC).

According to the touch display panel provided by one or more embodiments of the present disclosure, each of the light-shielding conductive patterns is provided with at least two hollowed-out areas, and one of the plurality of pixel units is disposed in each hollowed-out area.

According to the touch display panel provided by one or more embodiments of the present disclosure, each of the light-shielding conductive patterns is provided with hollowed-out areas for receiving a row of pixel units.

According to the touch display panel provided by one or more embodiments of the present disclosure, the touch display panel includes: a display region and a non-display region, and the plurality of light-shielding conductive patterns are located in the display region;

the non-display region is provided with: a plurality of connecting wires in a one-to-one correspondence with the plurality of light-shielding conductive patterns, and an end of each of the plurality of connecting wires is connected with the touch IC, and the other end of the connecting wire is connected with one of the plurality of light-shielding conductive patterns corresponding to the connecting wire.

According to the touch display panel provided by one or more embodiments of the present disclosure, the touch display panel further includes a base substrate, the BM and the plurality of pixel units are located on the base substrate, and the touch display panel further includes an anti-reflection layer which is disposed on at least one selected from the group consisting of a side of the BM close to the base substrate and a side of the BM away from the base substrate.

According to the touch display panel provided by one or more embodiments of the present disclosure, the touch display panel further includes light-shielding insulation patterns, the light-shielding insulation patterns are located at gaps of the plurality of light-shielding conductive patterns or located at gaps of the plurality of light-shielding conductive patterns and the plurality of pixel units.

According to the touch display panel provided by one or more embodiments of the present disclosure, each of the plurality of the pixel units includes a color filter (CF), and the plurality of pixel units include a first pixel unit and a second pixel unit;

the first pixel unit and the second pixel unit are respectively located in hollowed-out areas of two adjacent light-shielding conductive patterns, and the first pixel unit is adjacent to the second pixel unit; and the CF in the first pixel unit is extended towards the second pixel unit, the CF in the second pixel unit is extended towards the first pixel unit, and an extension portion of the CF in the first pixel unit is stacked on an extension portion of the CF in the second pixel unit.

According to the touch display panel provided by one or more embodiments of the present disclosure, the BM is located on the CF.

According to the touch display panel provided by one or more embodiments of the present disclosure, the touch display panel is an OLED touch display panel, and the touch display panel further includes: a base substrate, a protective layer and a cover plate, and the base substrate is oppositely arranged with the cover plate;

the plurality of pixel units are disposed on a side of the base substrate facing the cover plate, each of the plurality of pixel units further includes: at least one thin-film transistor (TFT), a first electrode, an emission layer (EML), a second electrode and an encapsulation layer, and the first electrode, the EML, the second electrode, the encapsulation layer and the CF are sequentially stacked on the base substrate;

the BM is disposed on the base substrate provided with the plurality of pixel units; and the protective layer is disposed on the base substrate provided with the BM.

According to the touch display panel provided by one or more embodiments of the present disclosure, the touch display panel is an OLED touch display panel, the touch display panel further includes: a base substrate, a protective layer and a cover plate, and the base substrate is oppositely arranged with the cover plate;

a plurality of light-emitting structures arranged in an array are disposed on a side of the base substrate facing the cover plate, each of the plurality of light-emitting structures includes: at least one thin-film transistor (TFT), a first electrode, an emission layer (EML), a second electrode and an encapsulation layer, and the first electrode, the EML, the second electrode and the encapsulation layer are sequentially stacked on the base substrate;

the BM is disposed on the base substrate provided with the plurality of light-emitting structures;

a plurality of CFs arranged in an array are disposed on the base substrate provided with the BM, each of the plurality of pixel units includes: one of the plurality of light-emitting structures and one of plurality of CFs stacked on the encapsulation layer in the light-emitting structure; and the protective layer is disposed on the base substrate provided with the plurality of CFs.

According to the touch display panel provided by one or more embodiments of the present disclosure, the touch display panel is a touch liquid crystal display panel.

At least one embodiment of the present disclosure provides a manufacturing method of a touch display panel, including:

manufacturing a touch display panel including a plurality of pixel units arranged in an array and a black matrix (BM); the BM is a conductor, and the BM includes a plurality of light-shielding conductive patterns which are insulated from each other.

According to the method provided by one or more embodiments of the present disclosure, the BM is connected with a touch integrated circuit (IC).

According to the method provided by one or more embodiments of the present disclosure, the touch display panel further includes a base substrate, the BM and the plurality of pixel units are formed on the base substrate, and the touch display panel further includes an anti-reflection layer which is formed on at least one selected from the group consisting of a side of the BM close to the base substrate and a side of the BM away from the base substrate.

According to the method provided by one or more embodiments of the present disclosure, the method further includes: forming a plurality of color filters (CFs), two adjacent CFs have an overlapped part, and the BM is located on the overlapped part of the two adjacent CFs.

According to the method provided by one or more embodiments of the present disclosure, the touch display panel is an OLED touch display panel, the touch display panel further includes: a base substrate, a protective layer and a cover plate, and manufacturing the touch display panel including the plurality of pixel units arranged in an array and the BM includes:

forming the plurality of pixel units on the base substrate, each of the plurality of pixel units including: at least one thin-film transistor (TFT), a first electrode, an emission layer (EML), a second electrode, an encapsulation layer and a color filter (CF), and the first electrode, the EML, the second electrode, the encapsulation layer and the CF being sequentially stacked on the base substrate;

forming the BM on the base substrate provided with the plurality of pixel units;

forming the protective layer on the base substrate provided with the BM; and oppositely arranging the base substrate provided with the protective layer with the cover plate, so that the protective layer is disposed between the base substrate and the cover plate.

According to the method provided by one or more embodiments of the present disclosure, the touch display panel is an OLED touch display panel, the touch display panel further includes: a base substrate, a protective layer and a cover plate, and manufacturing the touch display panel including the plurality of pixel units arranged in an array and the BM includes:

forming a plurality of light-emitting structures arranged in an array on the base substrate, each of the plurality of light-emitting structures including: at least one thin-film transistor (TFT), a first electrode, an emission layer (EML), a second electrode and an encapsulation layer, and the first electrode, the EML, the second electrode and the encapsulation layer are sequentially stacked on the base substrate;

forming the BM on the base substrate provided with the plurality of light-emitting structures;

forming a plurality of color filters (CFs) arranged in an array on the base substrate provided with the BM, each of the plurality of pixel units including: one of the plurality of light-emitting structures and one of the plurality of CFs stacked on the encapsulation layer in the light-emitting structure;

forming the protective layer on the base substrate provided with the plurality of CFs; and oppositely arranging the base substrate provided with the protective layer with the cover plate, so that the protective layer is disposed between the base substrate and the cover plate.

At least one embodiment of the present disclosure further provides a touch display device, including any one of the abovementioned touch display panels.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In an OLED display device with touch function, because the OLED display device further includes a touch panel, the entire OLED display device is thick.

Figure 1:
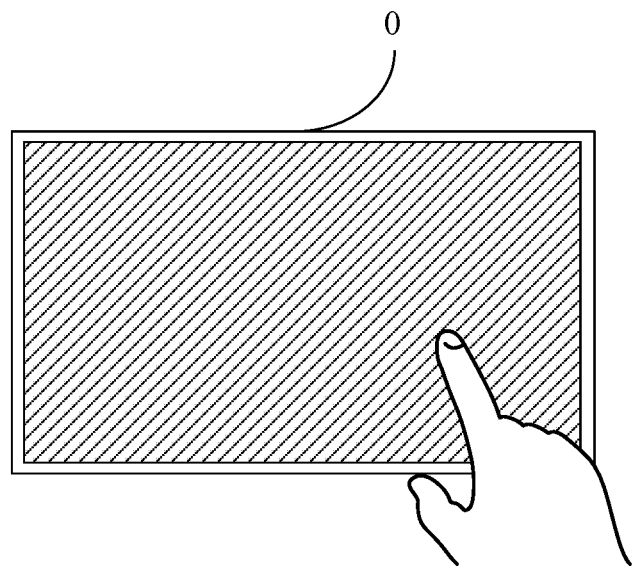
FIG. 1 is a schematic diagram illustrating the application scene of a touch display panel provided by an embodiment of the present disclosure.

FIG. 1 is a schematic diagram illustrating the application scene of a touch display panel provided by one or more embodiments of the present disclosure. As illustrated in FIG. 1, the touch display panel 0 simultaneously has touch and display functions. That is, a user can use a finger to touch the touch display panel 0, so that the touch display panel can display an image according to a position touched by the finger of the user.

Figure 2A:
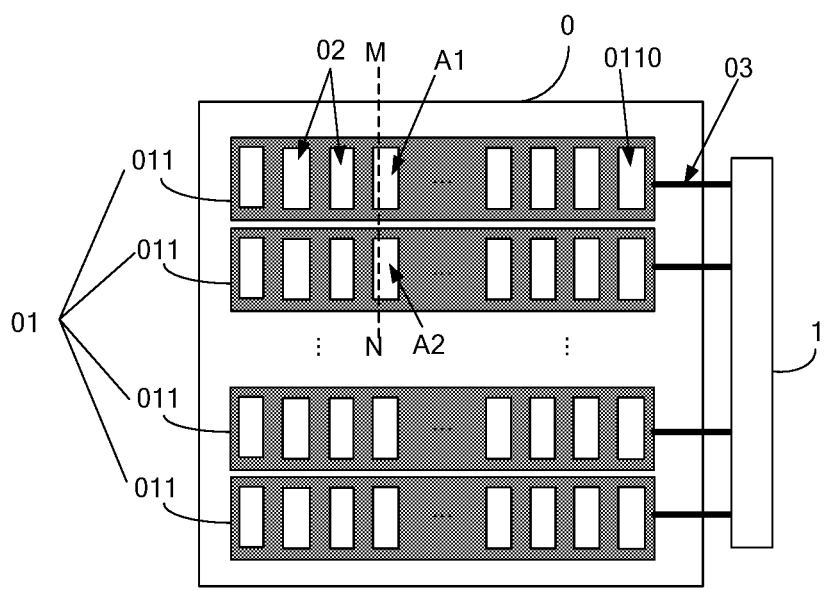
FIG. 2A is a top view of a touch display panel provided by an embodiment of the present disclosure.

FIG. 2A is a top view of a touch display panel provided by one or more embodiments of the present disclosure. As illustrated in FIG. 2, the touch display panel 0 may include: a black matrix (BM) 01; and a plurality of pixel units 02 arranged in an array. For example, the BM 01 is a conductor, is conductive, and is connected with a touch integrated circuit (IC) 1.

According to the touch display panel provided by one or more embodiments of the present disclosure, because the BM is a conductor and is connected with the touch IC, the touch function of the touch display panel can be directly realized through the touch IC and the BM, and there is no need to provide a touch panel on a display panel to form a touch display panel, so the thickness of both the touch display panel and the touch display device is reduced.

For example, the BM 01 may have light-shielding function, For example, may be made from metallic materials, but is not limited thereto.

It should be understood that the touch display panel in FIG. 2A may be an OLED touch display panel and may also be a liquid crystal display (LCD) touch display panel or a touch display panel of other types. No limitation will be given here in the embodiment of the present disclosure.

As illustrated in FIG. 2A, for example, the BM 01 may include: n light-shielding conductive patterns 011 which are insulated from each other, and n is an integer greater than or equal to 2. Each light-shielding conductive pattern 011 is provided with at least two hollowed-out areas 0110, and a pixel unit 02 is disposed in each hollowed-out area 0110. Furthermore, for example, each light-shielding conductive pattern 011 is provided with hollowed-out areas for receiving a row of pixel units 02. That is to say, each light-shielding conductive pattern 011 forms a touch area; the n light-shielding conductive patterns 011 form n touch areas; and each touch area is provided with at least two pixel units 02. For example, each light-shielding conductive pattern 011 may also be regarded as one touch line. For example, the plurality of light-shielding conductive patterns 011 may be parallel to each other.

FIG. 2A illustrates that each light-shielding conductive pattern 011 includes a plurality of hollowed-out areas 0110 arranged in a row direction.

The touch display panel 0 may include a display region and a non-display region, and the n light-shielding conductive patterns 011 may be disposed in the display region. The non-display region is provided with: n connecting wires 03 in a one-to-one correspondence with the n light-shielding conductive patterns 011. One end of each connecting wire 03 in the n connecting wires 03 is connected with the touch IC 1, and the other end of each connecting wire 03 is connected with one of the plurality of light-shielding conductive patterns 011 corresponding to the connecting wire. That is to say, each light-shielding conductive pattern 011 is connected to the touch IC 1 through a corresponding connecting wire 03.

For example, the touch display panel 0 may further include: an anti-reflection layer (not illustrated in FIG. 2A, may refer to FIG. 4) disposed on at least one side of the BM 01. For example, as illustrated in FIG. 2A, the touch display panel 0 may include anti-reflection layers respectively disposed on two sides of the BM 01. For example, in the case where an anti-reflection layer is disposed on a side of the BM 01 close to a light-emitting side of the touch display panel, the anti-reflection layer can prevent the BM 01 from reflecting ambient light, and reduce the reflectivity of the BM, thereby improving the display effect of the touch display panel. In the case where an anti-reflection layer is disposed on a side of the BM 01 away from the light-emitting side of the touch display panel, the anti-reflection layer can prevent the BM 01 from reflecting light in the touch display panel (for example, multiple reflection of internal metal wire) to a position between two light-shielding conductive patterns 011, and avoid light leakage, thereby improving the display effect of the touch display panel.

As illustrated in FIG. 2A, for example, the plurality of light-shielding conductive patterns are insulated from each other. For example, each light-shielding conductive pattern is conductive. For example, each light-shielding conductive pattern is respectively connected with the touch IC 1. For example, each light-shielding conductive pattern can be respectively applied with signals.

Figure 2B:
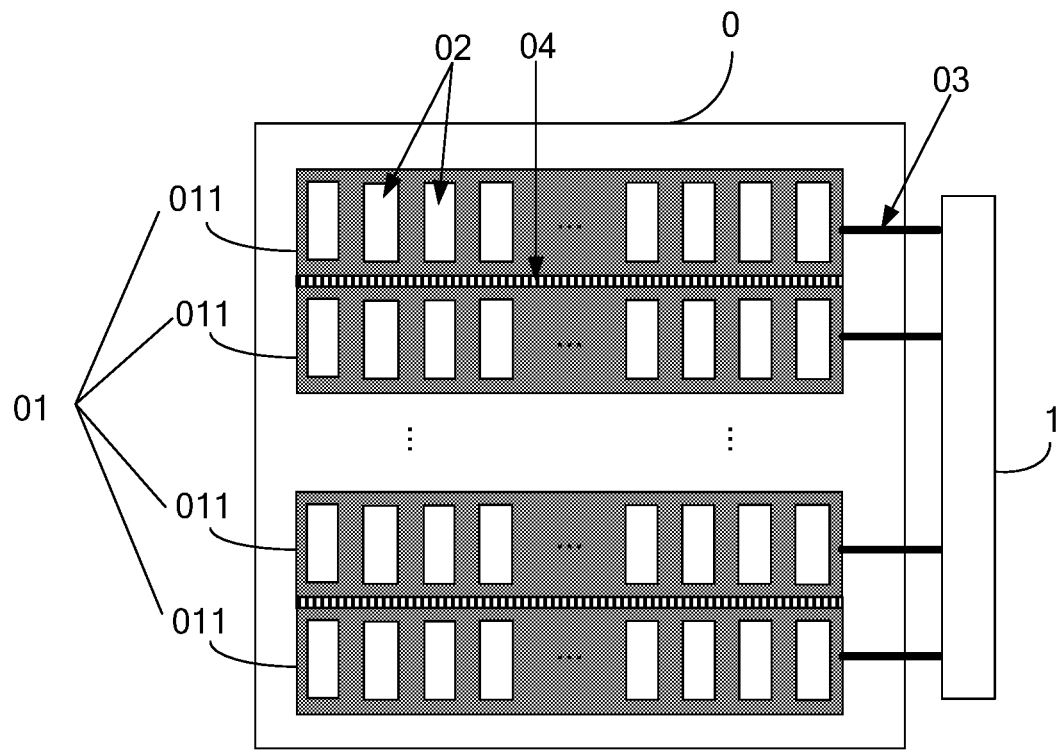
FIG. 2B is a top view of another touch display panel provided by an embodiment of the present disclosure.

FIG. 2B is a top view of another touch display panel provided by one or more embodiments of the present disclosure. As illustrated in FIG. 2B, the n light-shielding conductive patterns 011 are insulated from each other. That is to say, there is a gap between any two adjacent light-shielding conductive patterns 011. On the basis of FIG. 2A, the touch display panel 0 may further include: a light-shielding insulation pattern 04 disposed at a gap between adjacent light-shielding conductive patterns. The material of the light-shielding insulation pattern 04 may be black insulation material. The light-shielding insulation patterns 04 do not affect the mutual insulation of adjacent light-shielding conductive patterns 011. Moreover, under the action of the light-shielding insulation pattern 04, light in the touch display panel 0 cannot be emitted out of the touch display panel from the gap. Thus, the light can be prevented from being emitted out of the touch display panel from the gap, and hence the display effect of the touch display panel can be improved.

Figure 3A:
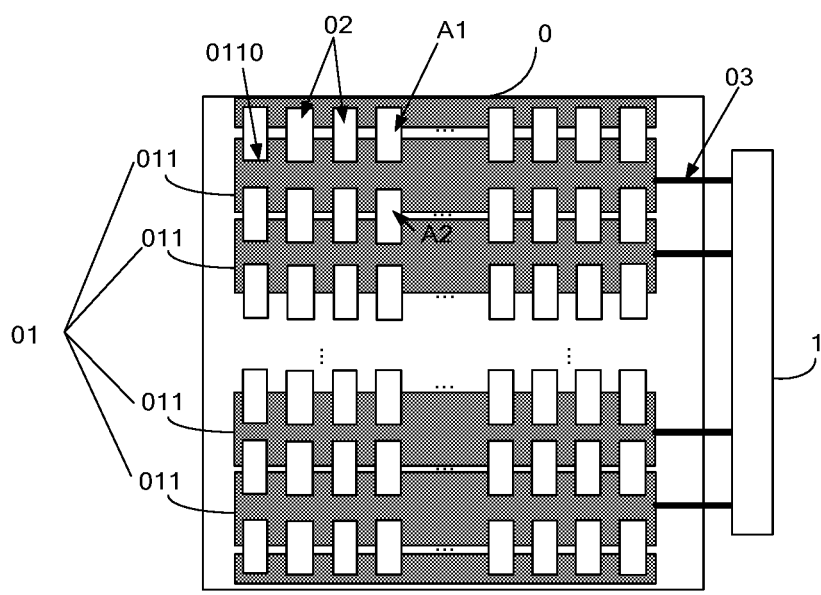
FIG. 3A is a schematic top view of a touch display panel provided by an embodiment of the present disclosure.

FIG. 3A is a schematic top view of a touch display panel provided by an embodiment of the present disclosure. In the display panel, a plurality of hollowed-out areas 0110 are disposed on each side of each light-shielding conductive pattern 011, and adjacent hollowed-out areas 0110 of two adjacent light-shielding conductive patterns 011 are oppositely arranged so as to form pixel units 02 at corresponding positions.

Figure 3B:
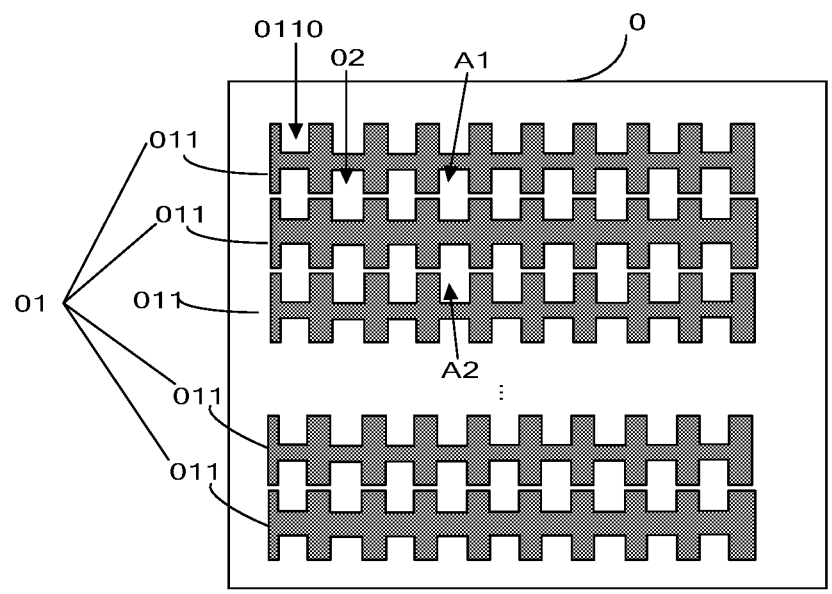
FIG. 3B is a schematic top view of a plurality of light-shielding conductive patterns 011 in the touch display panel provided by an embodiment of the present disclosure.

FIG. 3B is a schematic top view of the plurality of light-shielding conductive patterns 011 in the touch display panel provided by an embodiment of the present disclosure. As illustrated in FIG. 3B, adjacent hollowed-out areas 0110 of two adjacent light-shielding conductive patterns 011 are oppositely arranged so as to form pixel units 02 at corresponding positions.

Figure 3C:
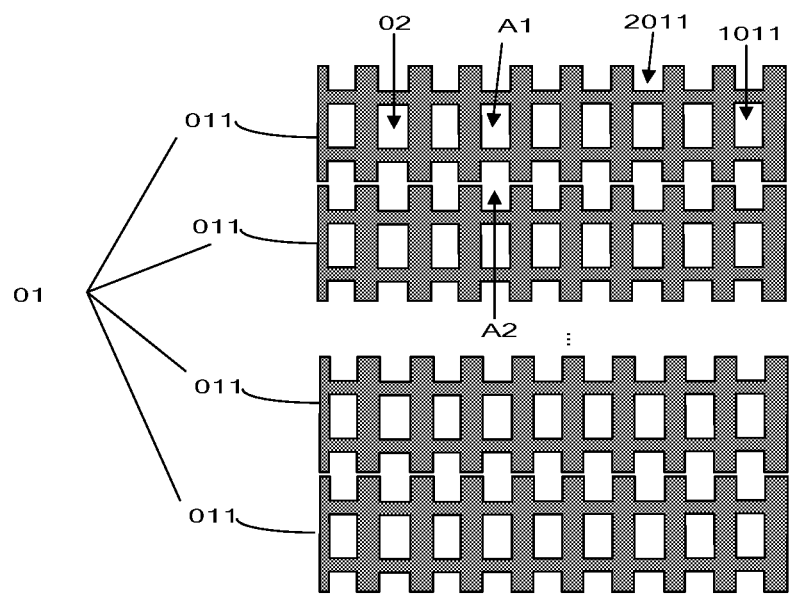
FIG. 3C is a schematic top view of a touch display panel provided by an embodiment of the present disclosure.

FIG. 3C is a schematic top view of a touch display panel provided by an embodiment of the present disclosure. In the display panel, each light-shielding conductive pattern 011 includes two types of hollowed-out areas, namely first hollowed-out areas 1011 disposed in the middle of the light-shielding conductive pattern 011 and a plurality of second hollowed-out areas 2011 disposed on both sides of the light-shielding conductive pattern 011. For example, an area of each first hollowed-out area 1011 is greater than an area of each second hollowed-out area 2011. Each first hollowed-out area 1011 may correspond to one pixel unit 02. Two adjacent hollowed-out areas of two adjacent light-shielding conductive patterns 011 are oppositely arranged so as to form pixel units 02 at corresponding positions.

For example, the above BM may be taken as one group of touch electrodes in a mutual-capacitance mode touch electrode group, and the other group of touch electrodes may be additionally arranged. For example, the other group of touch electrodes may be insulated from and intersected with the plurality of light-shielding conductive patterns 011.

Figure 3D:
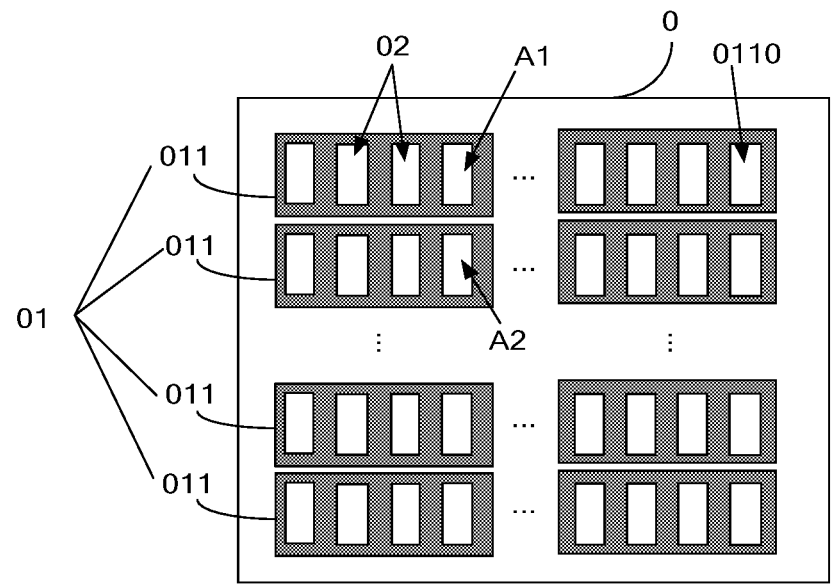
FIG. 3D is a schematic top view of a touch display panel provided by an embodiment of the present disclosure.

FIG. 3D is a schematic top view of a touch display panel provided by an embodiment of the present disclosure. For example, the plurality of light-shielding conductive patterns 011 in the BM in the embodiment may be arranged in an array. The touch position may be detected by adoption of self-capacitance touch mode.

Figure 3E:
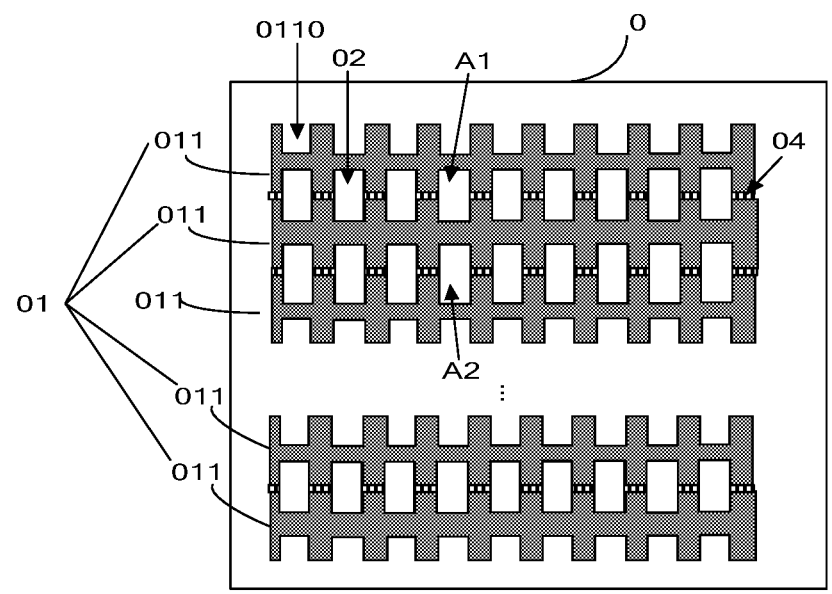
FIG. 3E is a schematic top view of a touch display panel provided by an embodiment of the present disclosure.

FIG. 3E is a schematic top view of a touch display panel provided by an embodiment of the present disclosure. The light-shielding insulation patterns 04 are disposed at gaps of the plurality of light-shielding conductive patterns 011 and the plurality of pixel units 02.

Figure 4:
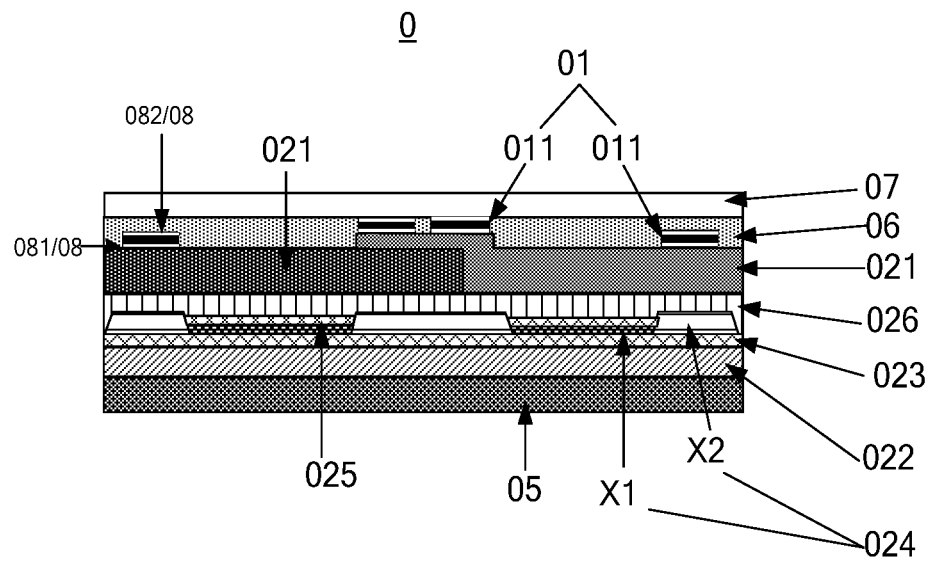
FIG. 4 is a schematic sectional view of a touch display panel provided by an embodiment of the present disclosure (may be a sectional view taken along line MN in FIG. 2A)

FIG. 4 is a schematic sectional view of a touch display panel provided by an embodiment of the present disclosure. The touch display panel 0 may be an OLED touch display panel.

As illustrated in FIG. 4, on the basis of FIG. 2A, each pixel unit 02 may include: a color filter (CF) 021.

For example, with reference to FIGS. 2A and 4, a first pixel unit A1 and a second pixel unit A2 are respectively disposed in hollowed-out areas of two adjacent light-shielding conductive patterns 011, and the first pixel unit A1 is adjacent to the second pixel unit A2. The CF 021 in the first pixel unit A1 is extended towards the second pixel unit A2; the CF 021 in the second pixel unit A2 is extended towards the first pixel unit A1; and an extension portion of the CF 021 in the first pixel unit A1 is stacked on an extension portion of the CF 021 in the second pixel unit A2. In one or more embodiments of the present disclosure, the CF of the first pixel unit and the CF of the second pixel unit are arranged to be respectively extended towards each other, and the extension portions of the two CFs are stacked. In this case, the stacked configuration of the extension portions of the two CFs can prevent light in the touch display panel from being emitted out of the touch display panel from the gap between two adjacent light-shielding conductive patterns so as to avoid light leakage, thereby improving the display effect of the touch display panel. For example, where the pixel units 02 as illustrated in FIG. 2A are located are active light-emitting areas.

As illustrated in FIG. 4, for example, the touch display panel 0 may further include: a base substrate 05, a protective layer 06 and a cover plate 07. The base substrate 05 and the cover plate 07 are oppositely arranged. A plurality of pixel units 02 are disposed on a side of the base substrate 05 facing the cover plate 07. Each pixel unit 02 may further include: at least one thin film transistor (TFT) 022, a first electrode 023, an emission layer (EML) 024, a second electrode 025 and an encapsulation layer 026, and the first electrode 023, the EML 024, the second electrode 025, the encapsulation layer 026 and the CF 021 are sequentially stacked on the base substrate 05. For example, the EML 024 may include: a plurality of electroluminescent blocks X1 arranged in an array; and pixel definition blocks X2 disposed between two adjacent electroluminescent blocks X1. A BM 01 is disposed on the base substrate 05 provided with the plurality of pixel units 02. The protective layer 06 is disposed on the base substrate 05 provided with the BM 01 to protect the touch display panel. For example, one of the first electrode 023 and the second electrode 025 is an anode, and the other is a cathode. Description is given in the embodiment with reference to the case where the first electrode 023 is an anode and the second electrode 025 is a cathode by way of example.

For example, the BM 01 may be provided to avoid color mixing.

For example, the protective layer 06 may be a hard coating layer, but is not limited thereto. For example, the protective layer 06 may be a transparent protective layer and may be made from inorganic or organic materials. For example, the protective layer 06 may be made from insulation materials.

In the touch display panel provided by one or more embodiments of the present disclosure, the CF is disposed beneath the BM, and in the process of manufacturing the touch display panel, the BM is formed after the plurality of CFs are formed. Thus, strong acid used in the process of forming the BM would not damage structures under the CFs, e.g., the TFT, the first electrode, the EML, the second electrode and the encapsulation layer, so the CFs can have the function of preventing the strong acid from affecting the structures under the CFs, so as to avoid failure of the OLED.

For example, as illustrated in FIG. 4, an anti-reflection layer 08 may include a first anti-reflection sublayer 081 and a second anti-reflection sublayer 082. The first anti-reflection sublayer 081 is disposed on a surface of the BM 01 close to the base substrate 05, and the second anti-reflection sublayer 082 is disposed on a surface of the BM 01 away from the base substrate 05.

Figure 5:
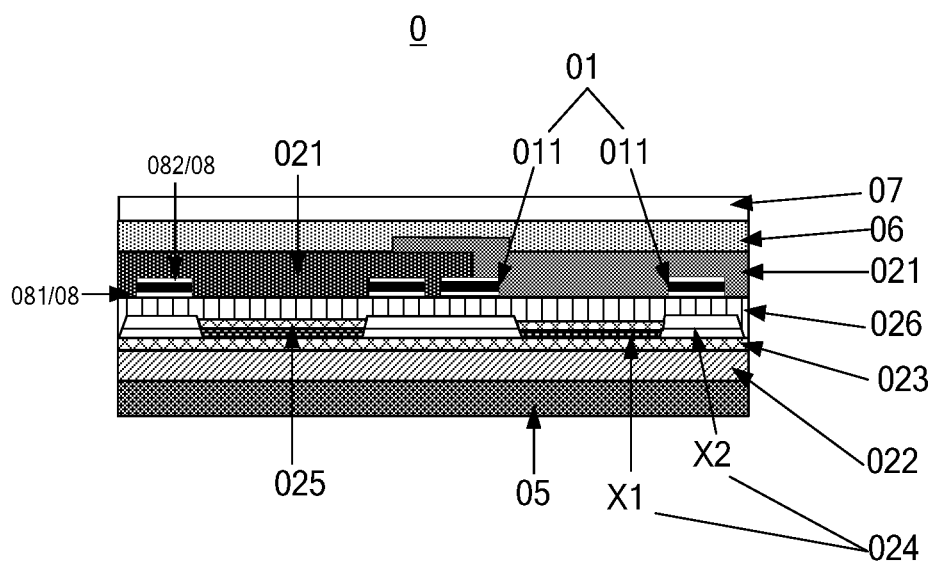
FIG. 5 is a schematic sectional view of another touch display panel provided by an embodiment of the present disclosure.

FIG. 5 is a schematic sectional view of another touch display panel provided by one or more embodiments of the present disclosure. The touch display panel 0 may be an OLED touch display panel. As illustrated in FIG. 5, on the basis of FIG. 2A, each pixel unit may include: a CF 021.

For example, with reference to FIGS. 2A and 5, a first pixel unit A1 and a second pixel unit A2 are respectively disposed in hollowed-out areas of two adjacent light-shielding conductive patterns 011, and the first pixel unit A1 is adjacent to the second pixel unit A2. The CF 021 in the first pixel unit A1 is extended towards the second pixel unit A2; the CF 021 in the second pixel unit A2 is extended towards the first pixel unit A1; and an extension portion of the CF 021 in the first pixel unit A1 is stacked on an extension portion of the CF 021 in the second pixel unit A2. In one or more embodiments of the present disclosure, the CF of the first pixel unit and the CF of the second pixel unit are arranged to be respectively extended towards each other, and the extension portions of the two CFs are stacked. In this case, the stacked configuration of the extension portions of the two CFs can prevent light in the touch display panel from being emitted out of the touch display panel from the gap between two adjacent light-shielding conductive patterns, thereby improving the display effect of the touch display panel.

For example, the touch display panel 0 may further include: a base substrate 05, a protective layer 06 and a cover plate 07. The base substrate 05 and the cover plate 07 are oppositely arranged. A plurality of light-emitting structures arranged in an array are disposed on a side of the base substrate 05 facing the cover plate 07. For example, each light-emitting structure includes: at least one TFT 022, a first electrode 023, an EML 024, a second electrode 025 and an encapsulation layer 026, and the first electrode 023, the EML 024, the second electrode 025 and the encapsulation layer 026 are sequentially stacked on the base substrate 05. For example, the EML 024 may include: a plurality of electroluminescent blocks X1 arranged in an array and pixel definition blocks X2 disposed between two adjacent electroluminescent blocks X1. A BM 01 is disposed on the base substrate 05 provided with the plurality of light-emitting structures. A plurality of CFs 021 arranged in an array are disposed on the base substrate 05 provided with the BM 01. Each pixel unit may include: one light-emitting structure and one CF 021 stacked on the encapsulation layer 026 in the light-emitting structure. The protective layer 06 is disposed on the base substrate 05 provided with the plurality of CFs 021. In the touch display panel provided by one or more embodiments of the present disclosure, the CFs are disposed on the BM, and in the process of manufacturing the touch display panel, the plurality of CFs are formed after the BM is formed.

Figures 6, 7:
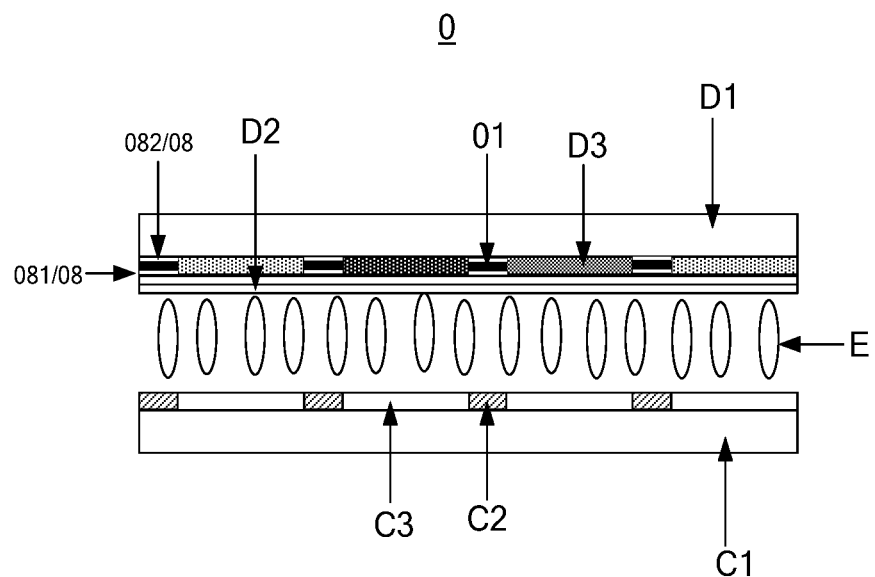
FIG. 6 is a schematic sectional view of still another touch display panel provided by an embodiment of the present disclosure.
FIG. 7 is a flowchart of a manufacturing method of a touch display panel provided by an embodiment of the present disclosure.

FIG. 6 is a schematic sectional view of still another touch display panel provided by one or more embodiments of the present disclosure. The touch display panel 0 may be an LCD touch display panel. As illustrated in FIG. 6, on the basis of FIG. 2A, the touch display panel may further include: an array substrate and a CF substrate.

For example, the array substrate includes: a first base substrate C1, TFTs C2 and pixel electrodes C3. For example, the CF substrate may include: a second base substrate D1, common electrodes D2, CFs D3 and BM 01. A liquid crystal layer E is disposed between the array substrate and the CF substrate.

In the touch display panel provided by one or more embodiments of the present disclosure, the BM is a conductor and is connected with a touch IC. Thus, the touch function of the touch display panel can be directly realized through the touch IC and the BM, and there is no need to provide an additional touch panel on the touch display panel, so the thickness of both the touch display panel and the display device can be reduced.

FIG. 7 is a flowchart of a manufacturing method of a touch display panel, provided by one or more embodiments of the present disclosure. As illustrated in FIG. 7, the manufacturing method of the touch display panel may include:

S701: manufacturing a touch display panel including a plurality of pixel units arranged in an array and a BM, the BM being a conductor and being connected with a touch IC.

In the touch display panel manufactured by the manufacturing method of the touch display panel, provided by one or more embodiments, the BM is a conductor and is connected with the touch IC. Thus, the touch function of the touch display panel can be directly realized through the touch IC and the BM, and there is no need to provide an additional touch panel on a display panel to form a touch display panel, thereby reducing the thickness of the touch display device.

For example, the touch display panel manufactured by the manufacturing method of the touch display panel as illustrated in FIG. 7 may be the touch display panel as illustrated by any one of FIGS. 2A, 2B, 4, 5 and 6.

Figure 8:
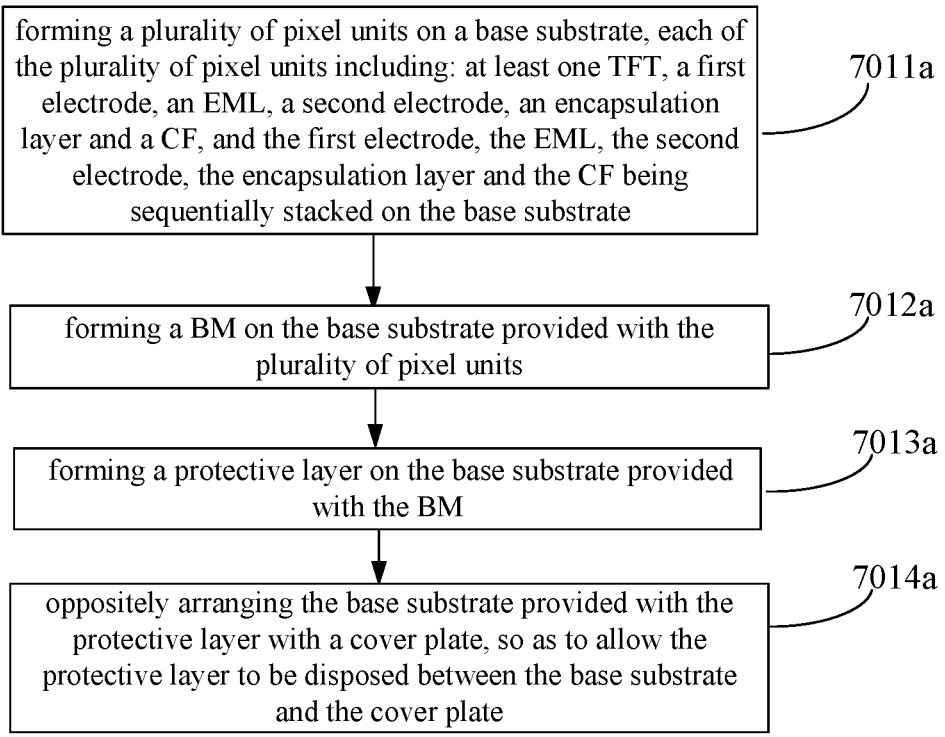
FIG. 8 is a flowchart of a manufacturing method of a touch display panel provided by an embodiment of the present disclosure.

On one hand, when the touch display panel, manufactured by the manufacturing method of the touch display panel as illustrated in FIG. 7, is as illustrated in FIG. 4, the step S701, as illustrated in FIG. 8, may include:

S7011a: forming a plurality of pixel units on a base substrate, each pixel unit including: at least one TFT, a first electrode, an EML, a second electrode, an encapsulation layer and a CF, and the first electrode, the EML, the second electrode, the encapsulation layer and the CF being sequentially stacked on the base substrate.

Figure 9A:
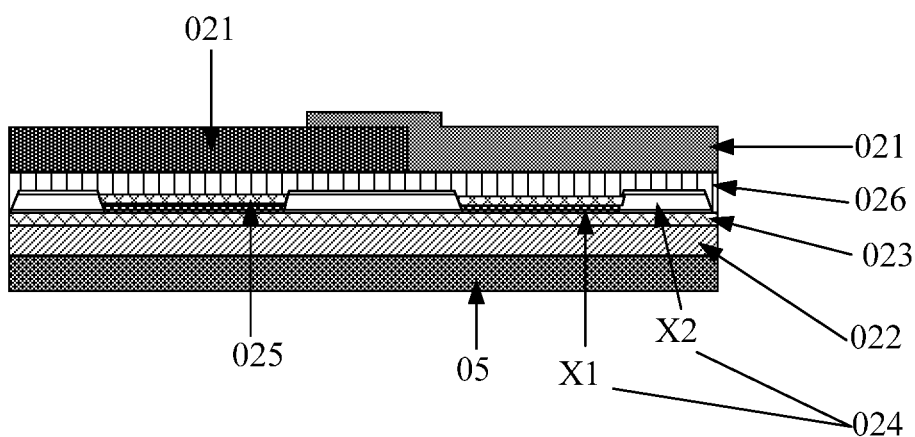
FIG. 9A is a schematic partial view of a structure of a touch display panel provided by an embodiment of the present disclosure.

As illustrated in FIG. 9A, in the step S7011a, the following structures may be sequentially formed on the base substrate 05: at least one TFT 022, a first electrode 023, an EML 024, a second electrode 025, an encapsulation layer 026 and a CF 021, so as to form a plurality of pixel units on the base substrate 05. For example, the EML 024 may include: a plurality of electroluminescent blocks X1 arranged in an array and a pixel definition block X2 disposed between two adjacent electroluminescent blocks X1.

S7012a: forming a BM on the base substrate provided with the plurality of pixel units.

Figure 9B:
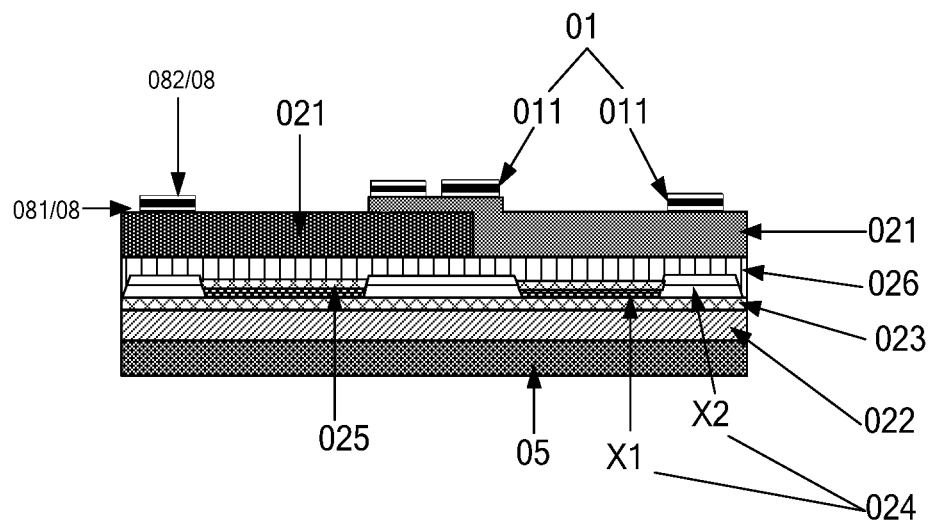
FIG. 9B is a schematic partial view of a structure of another touch display panel provided by an embodiment of the present disclosure.

As illustrated in FIG. 9B, in the step S7012a, a BM 01 may be formed on the base substrate 05 provided with the plurality of pixel units. For example, the distribution of the light-shielding conductive patterns in the BM 01 may refer to FIG. 2A.

For example, the BM 01 may include a plurality of light-shielding conductive patterns 011. Moreover, in the case where two adjacent pixel units on the base substrate are respectively disposed in adjacent hollowed-out areas of two adjacent light-shielding conductive patterns 011, CFs of the two pixel units are respectively extended towards each other, and extension portions of the CFs of the two pixel units are stacked. In this case, the stacked configuration of the extension portions of the two CFs can prevent light in the touch display panel from being emitted out of the touch display panel from the gap between two adjacent light-shielding conductive patterns, thereby improving the display effect of the touch display panel.

It should be understood that in the process of forming the BM, a black conductive layer is formed on the CFs at first, and subsequently, the plurality of light-shielding conductive patterns are formed by etching the black conductive layer with strong acid, and then the BM can be obtained. Because the CFs are disposed beneath the BM, the strong acid used in the process of forming the BM would not damage the structures under the CFs, e.g., the TFT, the first electrode, the EML, the second electrode and the encapsulation layer.

For example, before the BM 01 is formed, an anti-reflection layer may be formed on the base substrate provided with the plurality of pixel units at first, and subsequently, the BM 01 is formed on the base substrate provided with the anti-reflection layer; and after the BM 01 is formed, an anti-reflection layer may be further formed on the base substrate provided with the BM, so that the anti-reflection layers can be disposed on two sides of the BM (two opposite surfaces, including a surface close to the base substrate and a surface away from the base substrate). In the case where an anti-reflection layer is disposed on a side of the BM 01 close to a light-emitting side of the touch display panel, the anti-reflection layer can prevent the BM 01 from reflecting ambient light, so as to improve the display effect of the touch display panel. In the case where an anti-reflection layer is disposed on a side of the BM 01 away from the light-emitting side of the touch display panel, the anti-reflection layer can prevent the BM 01 from reflecting light in the touch display panel to a position between two light-shielding conductive patterns, so as to improve the display effect of the touch display panel.

S7013a: forming a protective layer on the base substrate provided with the BM.

Figure 9C:
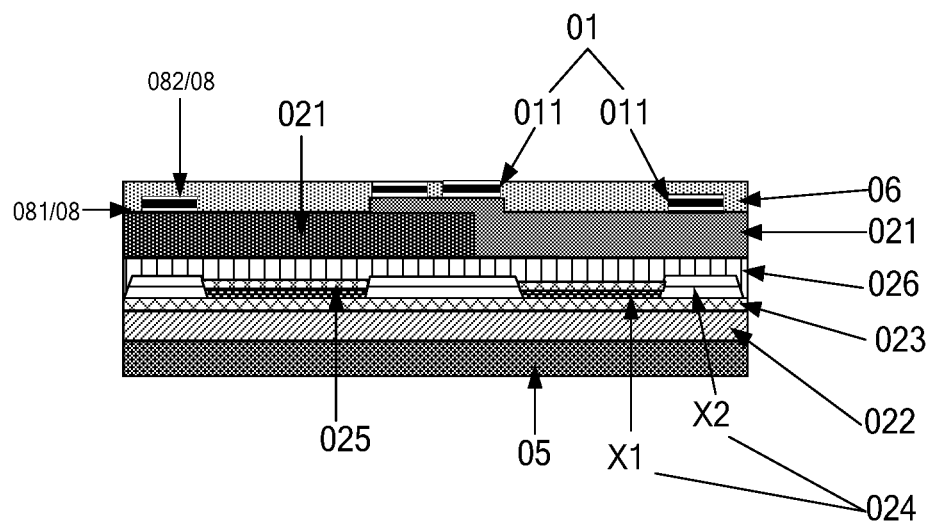
FIG. 9C is a schematic partial view of a structure of still another touch display panel provided by an embodiment of the present disclosure.

As illustrated in FIG. 9C, after the BM is formed, a protective layer 6 may be further formed on the base substrate 05. For example, the protective layer may be formed by coating, sputtering, deposition, etc.

S7014a: oppositely arranging the base substrate 05 provided with the protective layer 06 with the cover plate 07, so that the protective layer 06 is disposed between the base substrate 05 and the cover plate 07.

As illustrated in FIG. 4, after the protective layer 06 is formed, the base substrate 05 provided with the protective layer 06 may be directly covered by a cover plate 07, so as to obtain the touch display panel.

Figure 10:
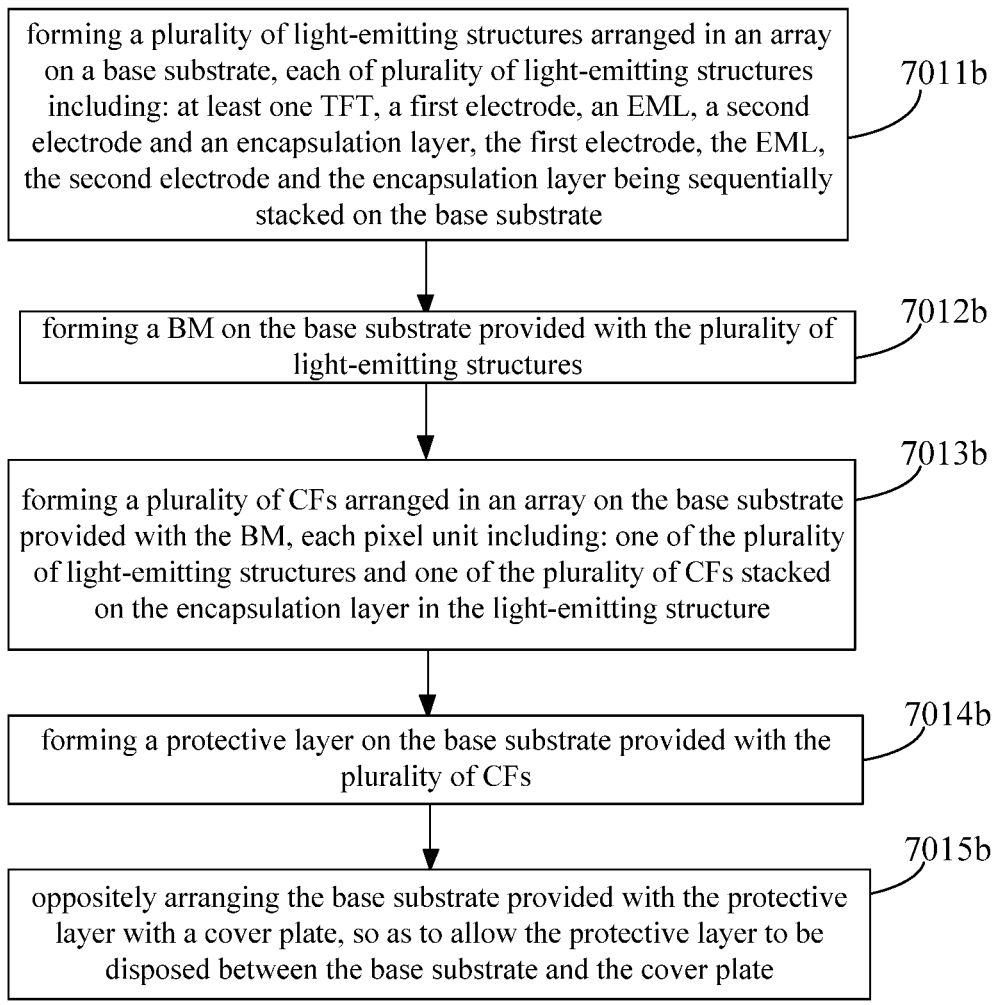
FIG. 10 is a flowchart of a manufacturing method of a touch display panel provided by an embodiment of the present disclosure.

On the other hand, when the touch display panel, manufactured by the manufacturing method of the touch display panel as illustrated in FIG. 7, is as illustrated in FIG. 5, the step S701, as illustrated in FIG. 10, may include:

S7011b: forming a plurality of light-emitting structures arranged in an array on the base substrate 05, each light-emitting structure including: at least one TFT, a first electrode, an EML, a second electrode and an encapsulation layer, and the first electrode, the EML, the second electrode and the encapsulation layer are sequentially stacked on the base substrate.

Figure 11A:
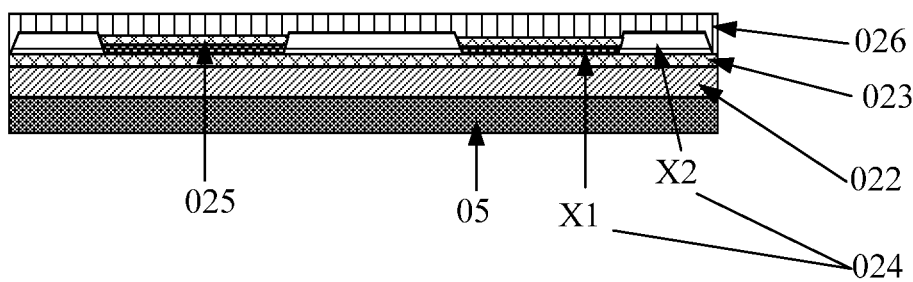
FIG. 11A is a schematic partial view of a structure of still another touch display panel provided by an embodiment of the present disclosure.

As illustrated in FIG. 11A, in the step S7011b, the following structures may be sequentially formed on the base substrate 05: at least one TFT 022, a first electrode 023, an EML 024, a second electrode 025 and an encapsulation layer 026, so as to form a plurality of light-emitting structures on the base substrate 05. For example, the EML 024 may include: a plurality of electroluminescent blocks X1 arranged in an array an a pixel definition block X2 disposed between two adjacent electroluminescent blocks X1.

S7012b: forming a BM 01 on the base substrate 05 provided with the plurality of light-emitting structures.

Figure 11B:
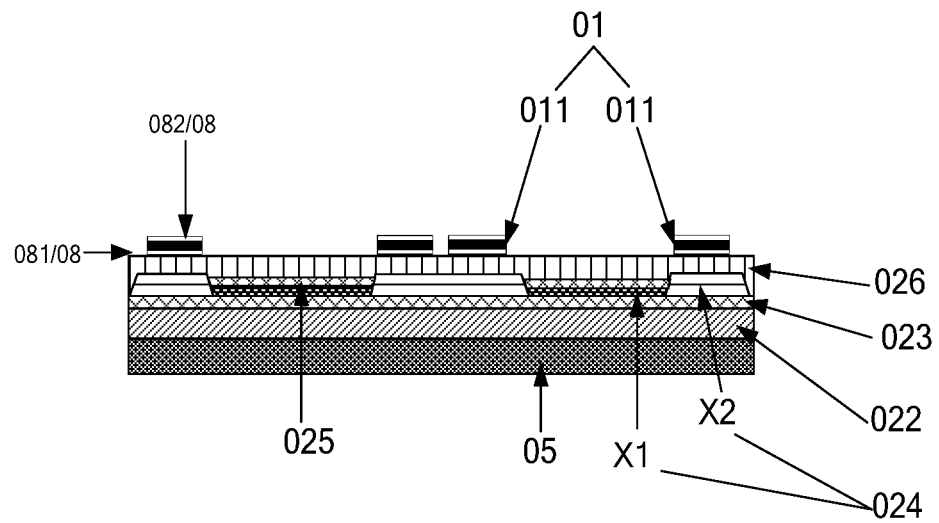
FIG. 11B is a schematic partial view of a structure of a touch display panel provided by another embodiment of the present disclosure.

As illustrated in FIG. 11B, in the step S7012b, the BM 01 may be formed on the encapsulation layer 026. For example, the distribution of the light-shielding conductive patterns in the BM 01 may refer to FIG. 2A.

For example, before the BM 01 is formed, an anti-reflection layer 08 may be formed on the base substrate provided with the plurality of pixel units at first, and subsequently, the BM 01 is formed on the base substrate 05 provided with the anti-reflection layer 08 (a first anti-reflection sublayer 081). After the BM 01 is formed, an anti-reflection layer (a second anti-reflection sublayer 082) may be further formed on the base substrate 05 provided with the BM 01, so that the anti-reflection layers 08 can be disposed on two sides of the BM 01.

S7013b: forming a plurality of CFs arranged in an array on the base substrate 05 provided with the BM 01. Each pixel unit includes: one light-emitting structure and one CF stacked on the encapsulation layer in the light-emitting structure.

Figure 11C:
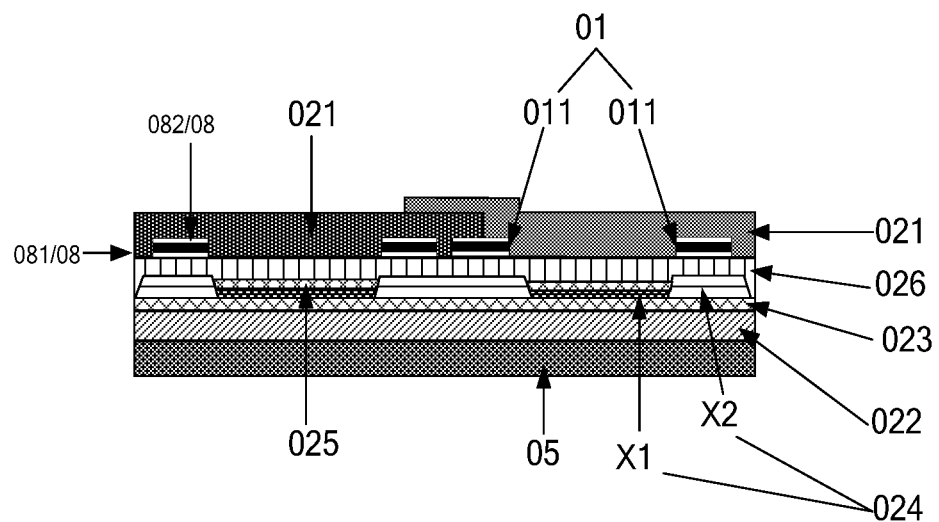
FIG. 11C is a schematic partial view of a structure of another touch display panel provided by another embodiment of the present disclosure.

As illustrated in FIG. 11C, in the step S7013b, a plurality of CFs 021 may be formed on the base substrate 05 provided with the BM 01.

For example, the BM 01 may include a plurality of light-shielding conductive patterns 011. Moreover, when two adjacent pixel units on the base substrate are respectively disposed in adjacent hollowed-out areas of two adjacent light-shielding conductive patterns 011, CFs of the two pixel units are respectively extended towards each other, and extension portions of the CFs of the two pixel units are stacked. In this case, the stacked configuration of the extension portions of the two CFs can prevent light in the touch display panel from being emitted out of the touch display panel from the gap between two adjacent light-shielding conductive patterns, thereby improving the display effect of the touch display panel.

S7014b: forming a protective layer 06 on the base substrate 05 provided with the plurality of CFs 021.

Figure 11D:
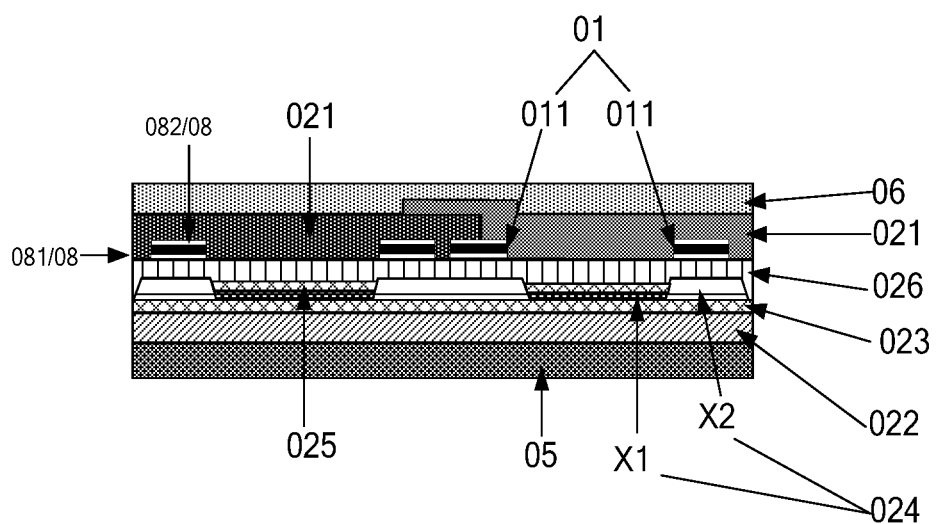
FIG. 11D is a schematic partial view of a structure of still another touch display panel provided by another embodiment of the present disclosure.

As illustrated in FIG. 11D, after the CFs 021 are formed, a protective layer 06 may be further formed on the base substrate 05. For example, the protective layer may be formed by coating, sputtering, deposition, etc.

S7015b: oppositely arranging the base substrate 05 provided with the protective layer 06 with the cover plate 07, so that the protective layer 06 is disposed between the base substrate 05 and the cover plate 07.

As illustrated in FIG. 5, after the protective layer 06 is formed, the base substrate 05 provided with the protective layer 06 may be directly covered by the cover plate 07, so as to obtain the touch display panel.

In the touch display panel manufactured by the manufacturing method of the touch display panel provided by one or more embodiments of the present disclosure, the BM is a conductor and is connected with a touch IC. Thus, the touch function of the touch display panel can be directly realized through the touch IC and the BM, and there is no need to provide an additional touch panel on a display panel to form a touch display panel, thereby reducing the thickness of both the touch display panel and the touch display device.

At least one embodiment of the present disclosure provides a touch display device, which may include: a touch display panel and a touch IC. The touch display panel may be the touch display panel as illustrated by any one of FIG. 2A, 2B, 4, 5 or 6.

In summary, in the touch display panel of the touch display device provided by at least one embodiment of the present disclosure, the BM is a conductor and is connected with the touch IC. Thus, the function of the touch display panel can be directly realized through the touch IC and the BM, and there is no need to provide an additional touch panel on a display panel to from a touch display panel, thereby reducing the thickness of the touch display device.

In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A touch display panel, comprising:
   a black matrix (BM);
   a plurality of pixel units arranged in an array; and
   light-shielding insulation patterns,
   wherein the BM comprises a plurality of light-shielding conductive patterns which are insulated from each other,
   wherein the light-shielding insulation patterns are located at gaps of the plurality of light-shielding conductive patterns or located at gaps of the plurality of light-shielding conductive patterns and the plurality of pixel units,
   wherein, in a plan view of the touch display panel, a size of each of the light-shielding insulation patterns in an extension direction of each of the light-shielding conductive patterns is not less than a size of the light-shielding conductive pattern in the extension direction of the light-shielding conductive pattern, and the extension direction of the light-shielding conductive pattern is intersected with an arrangement direction of the plurality of light-shielding conductive patterns, and
   wherein the BM, the plurality of pixel units, and the light-shielding insulation patterns are located on a base substrate, the extension direction of the light-shielding conductive pattern is parallel with the base substrate, and the arrangement direction of the plurality of light-shielding conductive patterns is parallel with the base substrate.

2. The touch display panel according to claim 1, wherein the BM is connected with a touch integrated circuit (IC).

3. The touch display panel according to claim 1, wherein each of the light-shielding conductive patterns is provided with hollowed-out areas for receiving pixel units of a row.

4. The touch display panel according to claim 2, wherein the touch display panel comprises: a display region and a non-display region, and the plurality of light-shielding conductive patterns are located in the display region;
   wherein the non-display region is provided with: a plurality of connecting wires in a one-to-one correspondence with the plurality of light-shielding conductive patterns, and an end of each of the plurality of connecting wires is connected with the touch IC, and the other end of the connecting wire is connected with one of the plurality of light-shielding conductive patterns corresponding to the connecting wire.

5. The touch display panel according to claim 1, wherein the touch display panel further comprises an anti-reflection layer which is disposed on at least one selected from the group consisting of a side of the BM close to the base substrate and a side of the BM away from the base substrate.

6. A touch display device, comprising the touch display panel according to claim 1.

7. The touch display panel according to claim 2, wherein the touch IC is configured to apply signals to each of the plurality of light-shielding conductive patterns respectively.

8. The touch display panel according to claim 5, wherein the anti-reflection layer is in contact with the BM.

9. The touch display panel according to claim 5, wherein an orthographic projection of the anti-reflection layer on the base substrate coincides with an orthographic projection of the BM on the base substrate.

10. The touch display panel according to claim 5, wherein the anti-reflection layer comprises a first anti-reflection sublayer and a second anti-reflection sublayer, the first anti-reflection sublayer is disposed on a surface of the BM close to the base substrate, and the second anti-reflection sublayer is disposed on a surface of the BM away from the base substrate.

11. A touch display panel, comprising:
    a black matrix (BM);
    a plurality of pixel units arranged in an array; and
    light-shielding insulation patterns,
    wherein the BM comprises a plurality of light-shielding conductive patterns which are insulated from each other,
    wherein the light-shielding insulation patterns are located at gaps of the plurality of light-shielding conductive patterns or located at gaps of the plurality of light-shielding conductive patterns and the plurality of pixel units, and
    wherein, in a plan view of the touch display panel, a size of each of the light-shielding insulation patterns in an extension direction of each of the light-shielding conductive patterns is not less than a size of the light-shielding conductive pattern in the extension direction of the light-shielding conductive pattern, and the extension direction of the light-shielding conductive pattern is intersected with an arrangement direction of the plurality of light-shielding conductive patterns;
    wherein the touch display panel further comprises a base substrate, wherein the BM and the plurality of pixel units are located on the base substrate, and the touch display panel further comprises an anti-reflection layer which is disposed on at least one selected from the group consisting of a side of the BM close to the base substrate and a side of the BM away from the base substrate;

wherein each of the plurality of the pixel units comprises a color filter (CF), the CF is located on the base substrate, and the plurality of pixel units comprise a first pixel unit and a second pixel unit, wherein the first pixel unit and the second pixel unit are located in hollowed-out areas of two adjacent light-shielding conductive patterns, respectively, and the first pixel unit is adjacent to the second pixel unit, wherein the CF in the first pixel unit is extended towards the second pixel unit, the CF in the second pixel unit is extended towards the first pixel unit, and a portion of the CF in the first pixel unit is stacked on a portion of the CF in the second pixel unit to form a stacked portion configured to block light, and wherein the stacked portion has a thickness greater than that of the CF in the first pixel unit and greater than that of the CF in the second pixel unit, and the BM is located on the stacked portion.

12. The touch display panel according to claim 11, wherein the BM is located on the CF.

13. The touch display panel according to claim 11, wherein the touch display panel is an organic light-emitting diode touch display panel, and the touch display panel further comprises: a protective layer and a cover plate, and the base substrate is oppositely arranged with the cover plate, wherein the plurality of pixel units are disposed on a side of the base substrate facing the cover plate, each of the plurality of pixel units further comprises: at least one thin-film transistor (TFT), a first electrode, an emission layer (EML), a second electrode and an encapsulation layer, and the first electrode, the EML, the second electrode, the encapsulation layer and the CF are sequentially stacked on the base substrate, wherein the BM is disposed on the base substrate provided with the plurality of pixel units, and wherein the protective layer is disposed on the base substrate provided with the BM.

14. The touch display panel according to claim 11, wherein the touch display panel is an organic light-emitting diode touch display panel, the touch display panel further comprises: a protective layer and a cover plate, and the base substrate is oppositely arranged with the cover plate, wherein a plurality of light-emitting structures arranged in an array are disposed on a side of the base substrate facing the cover plate, each of the plurality of light-emitting structures comprises: at least one thin-film transistor (TFT), a first electrode, an emission layer (EML), a second electrode and an encapsulation layer, and the first electrode, the EML, the second electrode and the encapsulation layer are sequentially stacked on the base substrate, wherein the BM is disposed on the base substrate provided with the plurality of light-emitting structures, wherein a plurality of CFs arranged in an array are disposed on the base substrate provided with the BM, and each of the plurality of pixel units comprises: one of the plurality of light-emitting structures and one of plurality of CFs stacked on the encapsulation layer in the light-emitting structure, and wherein the protective layer is disposed on the base substrate provided with the plurality of CFs.

15. A manufacturing method of a touch display panel, comprising:

manufacturing a touch display panel comprising a plurality of pixel units arranged in an array and a black matrix (BM), wherein the BM is a conductor, and the BM comprises a plurality of light-shielding conductive patterns which are insulated from each other, and forming light-shielding insulation patterns, wherein the light-shielding insulation patterns are located at gaps of the plurality of light-shielding conductive patterns or located at gaps of the plurality of light-shielding conductive patterns and the plurality of pixel units, and wherein, in a plan view of the touch display panel, a size of each of the light-shielding insulation patterns in an extension direction of each of the light-shielding conductive patterns is not less than a size of the light-shielding conductive pattern in the extension direction of the light-shielding conductive pattern, and the extension direction of the light-shielding conductive pattern is intersected with an arrangement direction of the plurality of light-shielding conductive patterns;

wherein the BM, the plurality of pixel units, and the light-shielding insulation patterns are located on a base substrate, the extension direction of the light-shielding conductive pattern is parallel with the base substrate, and the arrangement direction of the plurality of light-shielding conductive patterns is parallel with the base substrate.

16. The manufacturing method according to claim 15, wherein the BM is connected with a touch integrated circuit (IC).

17. The manufacturing method according to claim 15, further comprising: forming a plurality of color filters (CFs), wherein two adjacent CFs have an overlapped part, and the BM is located on the overlapped part of the two adjacent CFs.

18. The manufacturing method according to claim 15, wherein the touch display panel is an organic light-emitting diode touch display panel, the touch display panel further comprises: a protective layer and a cover plate, and manufacturing the touch display panel comprising the plurality of pixel units arranged in an array and the BM comprises:

forming the plurality of pixel units on the base substrate, wherein each of the plurality of pixel units comprises: at least one thin-film transistor (TFT), a first electrode, an emission layer (EML), a second electrode, an encapsulation layer and a color filter (CF), and the first electrode, the EML, the second electrode, the encapsulation layer and the CF are sequentially stacked on the base substrate;

forming the BM on the base substrate provided with the plurality of pixel units;

forming the protective layer on the base substrate provided with the BM; and oppositely arranging the base substrate provided with the protective layer with the cover plate, so that the protective layer is disposed between the base substrate and the cover plate.

19. The manufacturing method according to claim 15, wherein the touch display panel is an organic light-emitting diode touch display panel, the touch display panel further comprises: a protective layer and a cover plate, and manufacturing the touch display panel comprising the plurality of pixel units arranged in an array and the BM comprises:

forming a plurality of light-emitting structures arranged in an array on the base substrate, wherein each of the plurality of light-emitting structures comprises: at least one thin-film transistor (TFT), a first electrode, an emission layer (EML), a second electrode and an encapsulation layer, and the first electrode, the EML, the second electrode and the encapsulation layer are sequentially stacked on the base substrate;

forming the BM on the base substrate provided with the plurality of light-emitting structures;

forming a plurality of color filters (CFs) arranged in an array on the base substrate provided with the BM, wherein each of the plurality of pixel units comprises: one of the plurality of light-emitting structures and one of the plurality of CFs stacked on the encapsulation layer in the light-emitting structure;

forming the protective layer on the base substrate provided with the plurality of CFs; and oppositely arranging the base substrate provided with the protective layer with the cover plate, so that the protective layer is disposed between the base substrate and the cover plate.

* * * * *